United States Patent
Hasunuma

(10) Patent No.: US 8,786,000 B2
(45) Date of Patent: Jul. 22, 2014

(54) SEMICONDUCTOR DEVICE SUPPRESSING PEELING OF LOWER ELECTRODE OF CAPACITOR

(75) Inventor: Eiji Hasunuma, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/338,909

(22) Filed: Dec. 28, 2011

(65) Prior Publication Data

US 2012/0161281 A1    Jun. 28, 2012

(30) Foreign Application Priority Data

Dec. 28, 2010  (JP) ................................ 2010-292985

(51) Int. Cl.
*H01L 29/92*    (2006.01)

(52) U.S. Cl.
USPC ........... 257/306; 257/307; 257/308; 257/532; 257/E29.342

(58) Field of Classification Search
USPC ........................................ 257/532, 303, 296
See application file for complete search history.

(56) References Cited

U.S. PATENT DOCUMENTS

2006/0292812 A1*  12/2006  Jung et al. ............... 438/381

FOREIGN PATENT DOCUMENTS

| JP | 2003-297952 | 10/2003 |
| JP | 2010-067661 | 3/2010 |

* cited by examiner

*Primary Examiner* — Thanh Nguyen
(74) *Attorney, Agent, or Firm* — Young & Thompson

(57) ABSTRACT

A method of manufacturing a semiconductor device includes: forming a core insulating film that includes first openings, on a semiconductor substrate; forming cylindrical lower electrodes that cover sides of the first openings with a conductive film; forming a support film that covers at least an upper surface of the core insulating film between the lower electrodes; forming a mask film in which an outside of a region where at least the lower electrodes are formed is removed, by using the support film; and performing isotropic etching on the core insulating film so as to leave the core insulating film at a part of an area between the lower electrodes, after the mask film is formed.

10 Claims, 17 Drawing Sheets

SEMICONDUCTOR DEVICE SUPPRESSING PEELING OF LOWER ELECTRODE OF CAPACITOR

This application is based upon and claims the benefit of priority from Japanese Patent Application No. 2010-292985 filed on Dec. 28, 2010, the content of which is incorporated by reference.

BACKGROUND OF THE INVENTION

1. Field of the Invention

The present invention relates to a semiconductor device including a capacitor and a method of manufacturing the same.

2. Description of Related Art

Along with the spread of mobile terminals, such as mobile phones, demands for low power consumption on semiconductor devices mounted on mobile terminals have been increasing, and operating power source voltage of the semiconductor device tends to be lowered. Because of the need to ensure a stable low voltage supply, a power supply line in the semiconductor device is provided with a compensation capacitance element.

A technique of applying capacitors as compensation capacitance elements having the same structure as that in a memory cell region is disclosed in JP2010-67661A. As with the technique of JP2010-67661A, application of capacitors having a three-dimensional structure for memory cells allows the layout area of compensation capacitance element to be reduced.

Application of crown capacitors to capacitors of a compensation capacitance element allows the area of a region in which the compensation capacitance element is formed (hereinafter, referred to as compensation capacitance region) to be further reduced. However, there is a possibility that the crown capacitors will be destroyed during the manufacturing process. In order to address this problem, an example of a technique of preventing crown capacitors from being destroyed is disclosed in JP2003-297952A. The technique disclosed in JP2003-297952A prevents the crown lower electrode in the manufacturing process from being destroyed, by means of guard rings and a support film.

In order to further reduce the area of the compensation capacitance region, a structure that supports capacitors only by a support film connecting the capacitors without providing any guard ring has been examined.

In a memory cell region, a multiplicity of crown electrodes are arranged in one integrated region. Accordingly, only connection by a support film can prevent the capacitor from being destroyed. On the other hand, also in a compensation capacitance region, although the number of capacitors is smaller than that in the memory cell region, arrangement of about ten thousands of capacitors can prevent the capacitors from being destroyed only by connection of a support film without any guard ring. The crown capacitor formed without any guard ring is hereinafter referred to as a crown capacitor with a guard ring-less structure.

The inventor of the present application has examined applying the crown capacitor with a guard ring-less structure to a compensation capacitance element, and thereby discovered that there is a problem which differs from the problem in which capacitors get destroyed. Through a process of manufacturing the crown capacitors, the problem will hereinafter be described.

The process of manufacturing the crown capacitor is simply described in a manner separated into seven steps: (1) after elements, such as MOS transistors, are formed on a semiconductor substrate, an oxide film for forming cylinders (hereinafter, referred to as core oxide film) is formed on the semiconductor substrate; (2) a nitride film is formed as a support film on the core oxide film; then, (3) cylinder holes are formed at the core oxide film and the support film, and subsequently; (4) the walls of the cylinder holes are covered with conductive films and thereby cylinder-type lower electrodes are formed; (5) the support film is patterned to form opening patterns arranged on the support film at certain intervals; further, (6) wet etching is performed, masked with the support film, and the core oxide film is removed; and subsequently (7) the exposed surfaces of the cylinder-type lower electrodes are covered with a capacitance film, and a conductive film is embedded in gaps between the cylinder-type lower electrodes, thereby forming upper electrodes.

Between the steps (6) and (7), in order to wash chemical solution of the wet etching, a cleaning step is performed on the semiconductor substrate. During the cleaning step, the cylinder-type lower electrode is required not to be destroyed. During the cleaning step, a stream of water applies a lateral force to the cylinder-type lower electrodes. However, the tops of the cylinder-type lower electrodes are connected to each other by the support nitride film. This can prevent the cylinder-type lower electrodes from separately being destroyed.

On the other hand, at lower parts of the cylinder-type lower electrodes, the bottoms of the cylinder-type lower electrodes contact only pads. In comparison with the memory cell region, the area of the mat corresponding to the bottom pattern of the cylinder-type lower electrodes in the compensation capacitance region is small. Accordingly, the force that brings the cylinder-type lower electrode into intimate contact with the lower layer is small. There is the possibility of the danger that the processed film, in the area where the lower electrodes have been formed, may peel off. The peeling of the processed film is referred to as "mat skipping", which causes the problem in which the compensation capacitance element is not formed.

SUMMARY

In one embodiment, there is provided a method of manufacturing a semiconductor device that includes: forming a core insulating film that includes first openings, on a semiconductor substrate; forming cylindrical lower electrodes that cover sides of the first openings with a conductive film; forming a support film that covers at least an upper surface of the core insulating film between the lower electrodes; forming a mask film in which an outside of a region where at least the lower electrodes are formed is removed, by using the support film; and performing isotropic etching on the core insulating film so as to leave the core insulating film at a part of an area between the lower electrodes, after the mask film is formed.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

(First Exemplary Embodiment)

Figure 1:
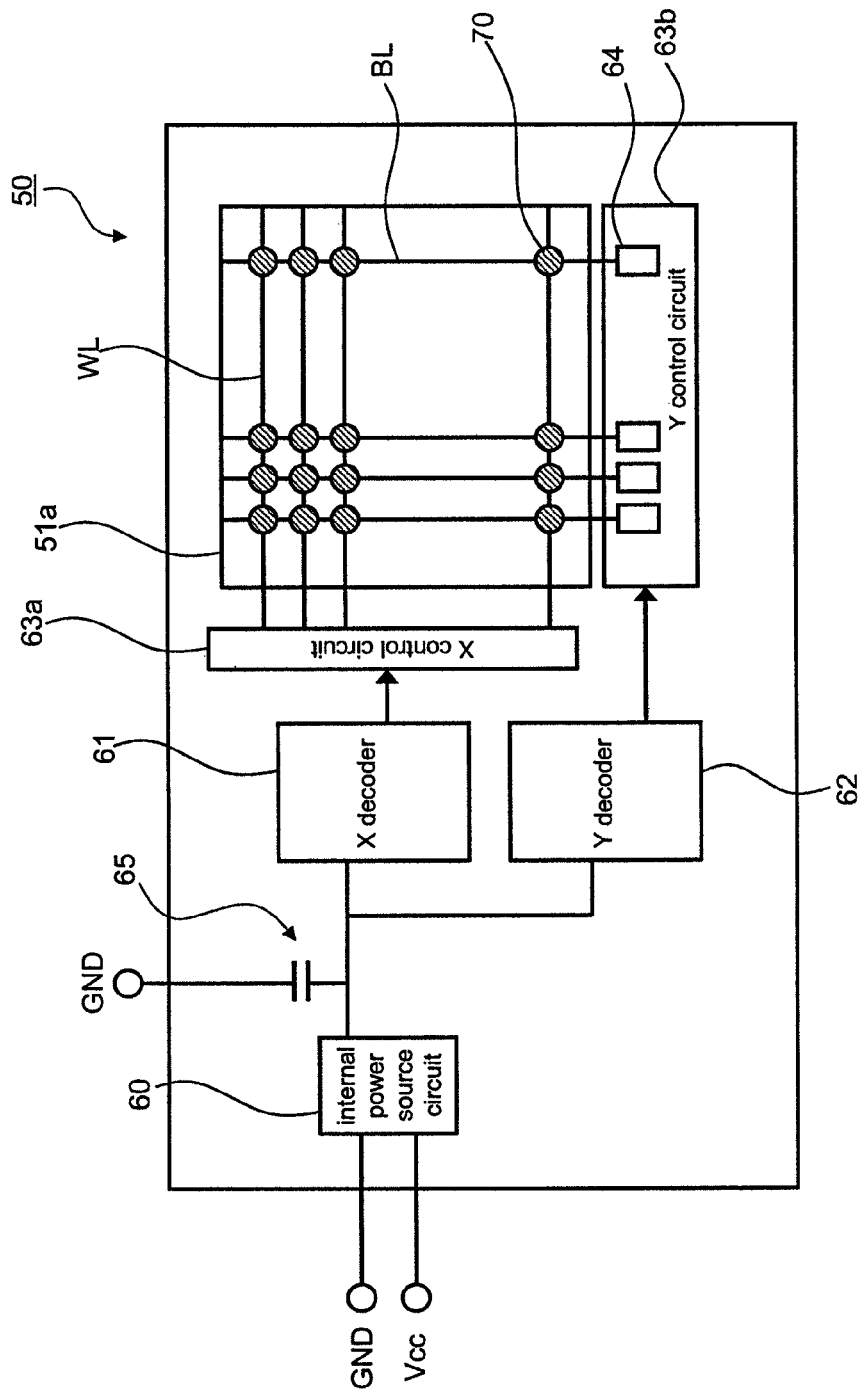
FIG. 1 is a block diagram showing a main part of a semiconductor device of a first exemplary embodiment.

A configuration of a semiconductor device of this exemplary embodiment will be described. The semiconductor device of this exemplary embodiment is a DRAM. FIG. 1 is a block diagram showing a main part of the semiconductor device of this exemplary embodiment.

As shown in FIG. 1, semiconductor device 50 includes memory cell array 51a including memory cells 70, X decoder 61, Y decoder 62, and internal power source circuit 60 that provides each decoder with internal power source voltage.

Memory cell array 51a includes word lines WL and bit lines BL. Memory cells 70 are provided at respective points at which word lines WL and bit lines BL intersect with each other. Memory cell 70 has a configuration including a capacitor for holding data, and a MOS transistor for selection.

Internal power source circuit 60 is supplied with external power source potential Vcc and ground potential GND from the outside of semiconductor device 50. Internal power source circuit 60 generates an internal power source voltage, having been lowered (stepped down) to a prescribed voltage from external power source potential Vcc, and supplies the internal power source voltage to X decoder 61 and Y decoder 62.

As shown in FIG. 1, along a wiring supplying internal power source voltage from internal power source circuit 60 to X decoder 61 and Y decoder 62, compensation capacitance element 65 is provided between the wiring and ground potential GND. Compensation capacitance element 65 suppresses variation of internal power source voltage supplied from internal power source circuit 60 to X decoder 61 and Y decoder 62.

X control circuit 63a is provided between X decoder 61 and memory cell array 51a. X control circuit 63a is connected to word lines WL of memory cell array 51a. Y control circuit 63b is provided between Y decoder 62 and memory cell array 51a. Y control circuit 63b is provided with sense amplifiers 64 corresponding to respective bit lines BL of memory cell array 51a. Bit lines BL are connected to respective sense amplifiers 64.

In an operation of reading data, when an address signal is input into X decoder 61 from the outside via a signal line, not shown, X control circuit 63a selects one word line WL among word lines WL according to the address signal input from the X decoder 61. When an address signal is input to Y decoder 62 from the outside via a signal line, not shown, Y control circuit 63b selects one bit line BL among bit lines BL according to the address signal input from Y decoder 62. The selection of one word line WL and one bit line BL allows memory cell 70 disposed at the intersection of these lines to be selected. Data held in the capacitor of selected memory cell 70 is input into sense amplifier 64 via bit line BL, the signal voltage is amplified by sense amplifier 64 and subsequently output to the outside via a signal line, not shown.

Figure 2:
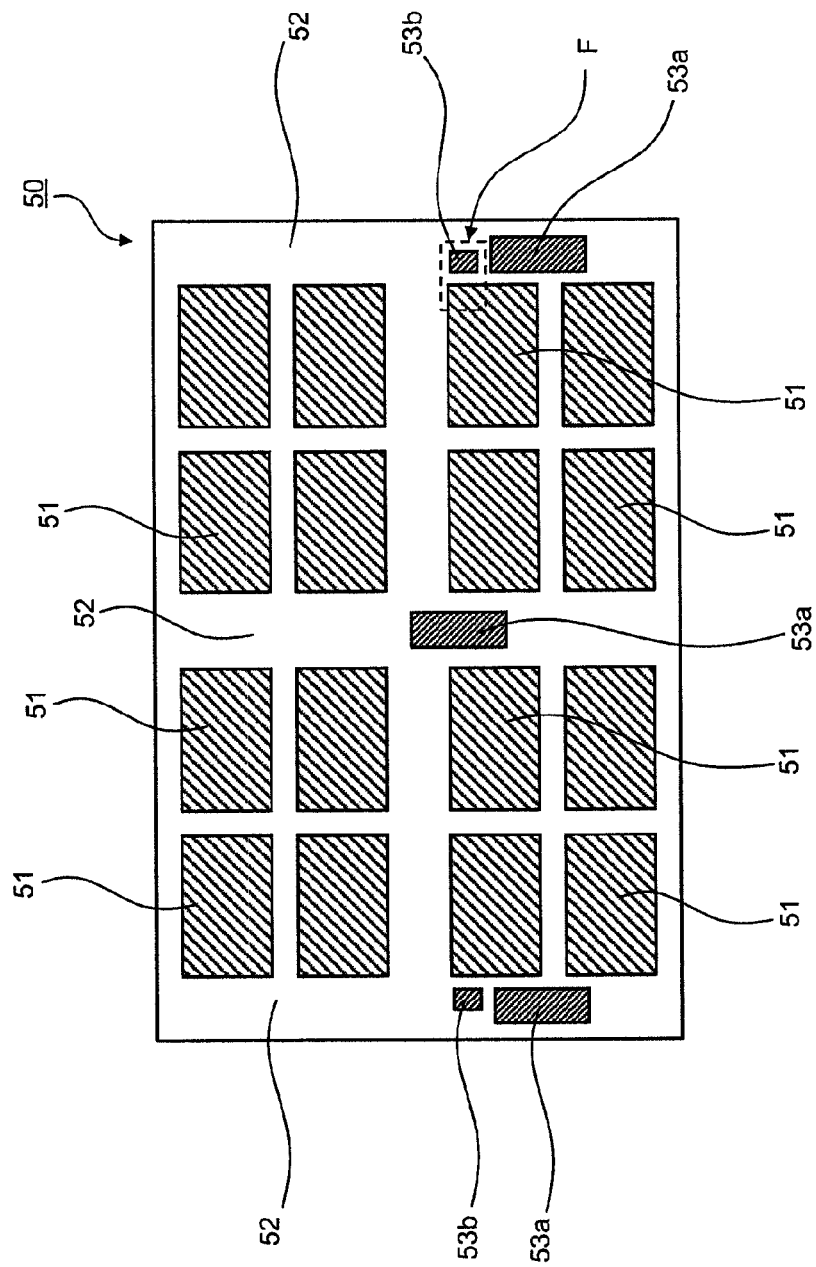
FIG. 2 is a plan view showing a layout of the semiconductor device of the first exemplary embodiment on a chip.

Next, a layout of the semiconductor device of this exemplary embodiment on a chip will be described. FIG. 2 is a plan view showing the layout of the semiconductor device of the first exemplary embodiment on the chip.

As shown in FIG. 2, memory cell regions 51 are arranged on semiconductor device 50. Each memory cell region 51 includes memory cell array 51a shown in FIG. 1. Peripheral circuit region 52 is arranged so as to surround memory cell region 51. Circuit blocks other than the memory cell array are arranged in peripheral circuit region 52. The circuit blocks other than the memory cell array include sense amplifiers and decoder circuits. Referring to FIG. 1 for illustration, not only X decoder 61, Y decoder 62 and internal power source circuit 60, but also compensation capacitance element 65 is included in the circuit blocks other than memory cell array. The layout shown in FIG. 2 is an example. The number of memory cell regions 51 and arrangement thereof are not limited to the layout shown in FIG. 2.

Compensation capacitance regions 53a and 53b are provided in a part of peripheral circuit region 52. Compensation capacitance elements 65 shown in FIG. 1 are arranged in compensation capacitance regions 53a and 53b. Although it will be described later in detail, compensation capacitance regions 53a and 53b are provided with capacitors having a structure analogous to that of a crown capacitor formed in memory cell region 51. Peripheral circuit regions 52 are classified into compensation capacitance region 53a with a large mat and compensation capacitance region 53b with a small mat according to a required capacitance value and limitation of a region. Compensation capacitance region 53b with the small mat tends to cause mat skipping during the formation step.

The reason for this is as follows. Since, in compensation capacitance region 53b that has the small mat, the individual lower electrodes supports each other via the support film against a lateral force due to a stream of water in a cleaning step, the individual lower electrodes are not destroyed. In contrast, in a case where the area of the mat is small, the number of lower electrodes is accordingly small and thus intimate contact force between the lower electrodes and the lower layer is small.

Figure 3:
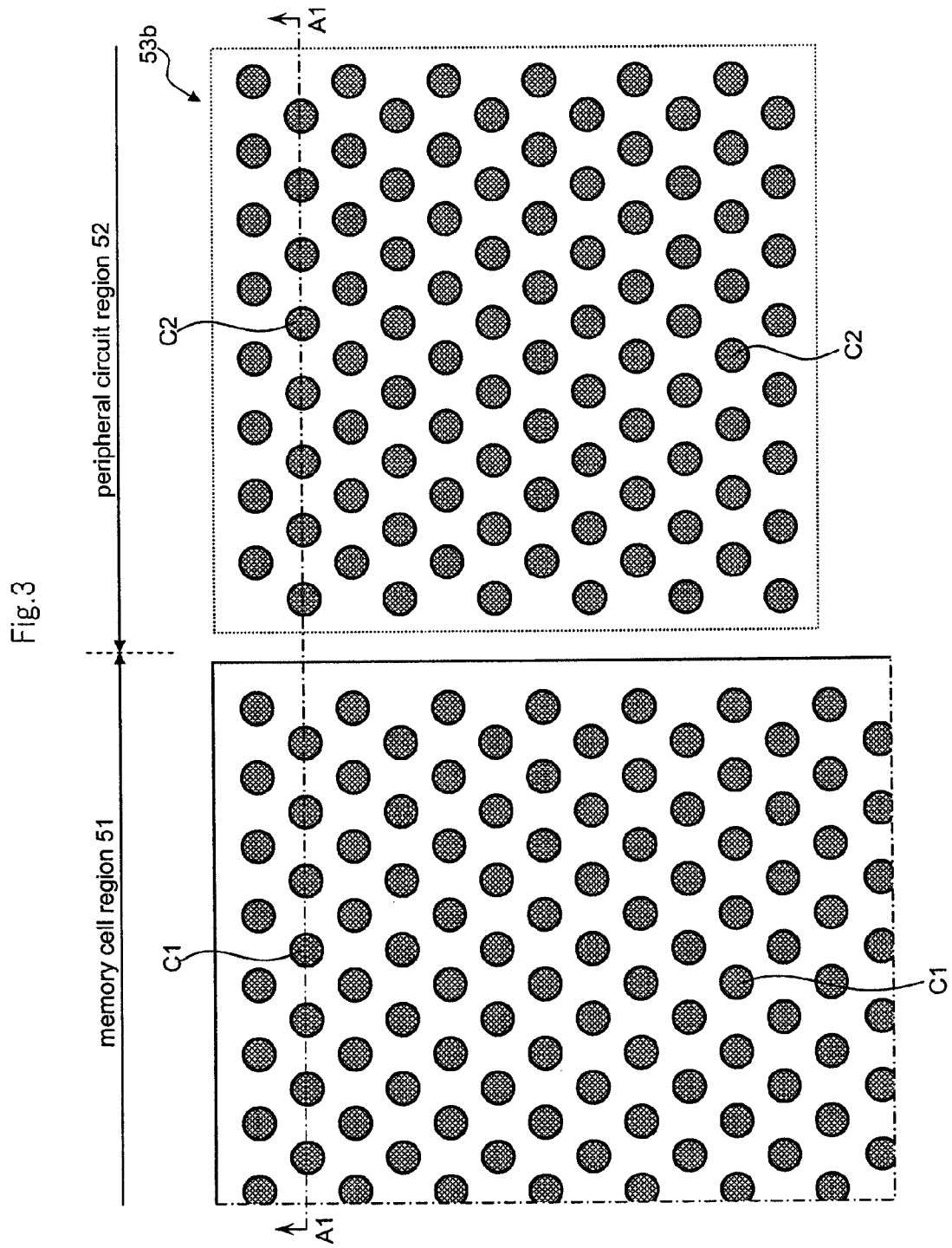
FIG. 3 is an enlarged plan view showing region F shown in FIG. 2.

Next, in comparison between memory cell region 51 and the part of peripheral circuit region 52 including compensation capacitance region 53b with the small mat, the layout of capacitors in each region will be described. FIG. 3 is an enlarged plan view showing region F shown in FIG. 2.

As shown in FIG. 3, capacitors C1 are arranged in memory cell region 51. Capacitors C1 are arranged for respective memory cells 70 shown in FIG. 1. Capacitor C1 includes a crown electrode. The crown electrode denotes an electrode structure in which both outer and inner walls of an electrode formed into a cylindrical shape (cup shape, tubular shape) are used as capacitor electrodes. Any of layouts referred to as 8F2, 6F2, 4F2 and the like in general may be applied to a method of arranging capacitors in memory cell region 51. The capacitor having the crown electrode structure is referred to as the crown capacitor.

As shown in FIG. 3, capacitors C2 are arranged in compensation capacitance region 53b. Capacitors C2 configure compensation capacitance elements 65. In semiconductor device 50 of this exemplary embodiment, the electrode structure of capacitor C2 in compensation capacitance element 65 has the same crown electrode structure as that of capacitor C1 in memory cell 70.

However, compensation capacitance element 65 arranged in compensation capacitance region 53b has a configuration in which lower and upper electrodes of capacitors C2 are connected to themselves. Accordingly, compensation capacitance element 65 integrates individual capacitances of capacitors C2 into one, and thereby has a large capacitance. Electrode structures of capacitor C2 in compensation capacitance region 53b and capacitor C1 in memory cell region 51 are common to each other. However, compensation capacitance element 65 and capacitor C1 are different in capacitance from each other.

Next, a manufacturing method of the capacitors in the semiconductor device of this exemplary embodiment will be described in detail. FIGS. 4 to 15 are sectional and plan views of a primary part showing the step of manufacturing the semiconductor device of this exemplary embodiment.

Hereinafter, capacitors C1 provided in memory cell region 51 are compared with capacitors C2 provided in compensation capacitance region 53b with the small mat among capacitors C2 configuring compensation capacitance element 65 provided in peripheral circuit region 52. A characteristic structure in the semiconductor device of this exemplary embodiment will be described in the process of describing the manufacturing method.

Figure 4:
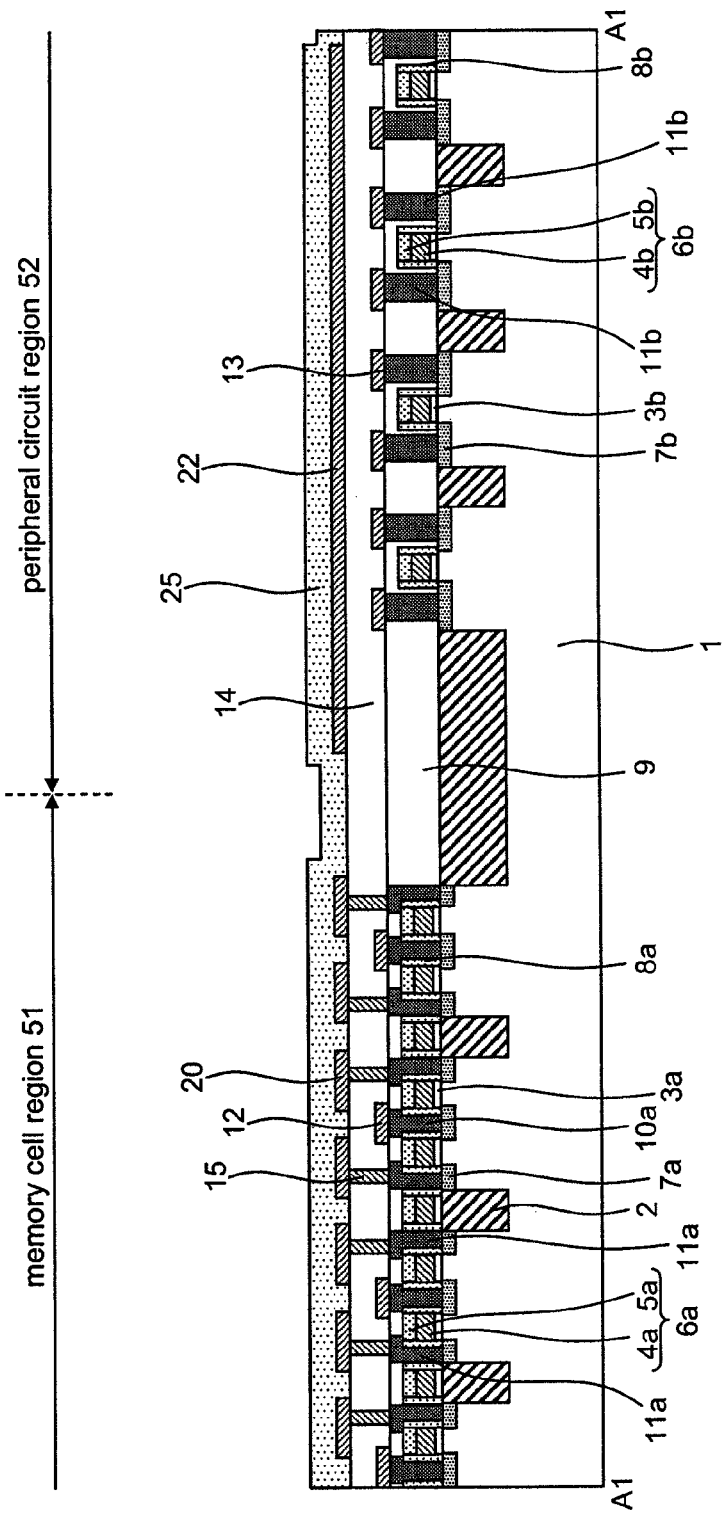
FIG. 4 is a sectional view of a primary part showing a step of manufacturing the semiconductor device of the first exemplary embodiment.

Referring to FIG. 4, a structure before a step of forming the capacitor will simply be described. FIG. 4 shows a sectional view that corresponds to a part taken along line A1-A1 shown in FIG. 3. However, FIG. 4 shows a structure before formation of the capacitor.

In semiconductor substrate 1 made of p-type silicon (Si), element separation 2 is formed by the STI (Shallow Trench Isolation) method. A region separated by element separation 2 in semiconductor substrate 1 becomes an active region. MOS transistors are formed in the active region. In this exemplary embodiment, description is made using a case where the MOS transistor is a planar MOS transistor. The MOS transistor may be a MOS transistor having a groove gate electrode or a vertical MOS transistor.

In peripheral circuit region 52, MOS transistors are arranged below compensation capacitance element 65 to be formed later. Such a configuration allows a footprint of a circuit on the semiconductor chip to be reduced. The present invention is also applicable to a structure in which MOS transistors are not arranged below compensation capacitance element 65.

In the active region of memory cell region 51 there are provided gate insulating film 3a, gate electrodes 6a formed on gate insulating film 3a, impurity diffusion layer 7a introduced in proximity to a surface of semiconductor substrate 1, and side wall film 8a formed on the side of gate electrode 6a. Gate electrode 6a is formed by patterning a laminated body of gate conductive film 4a and protective insulating film 5a.

In peripheral circuit region 52, as with memory cell region 51, gate insulating film 3b, gate electrodes 6b formed on gate insulating film 3b, impurity diffusion layer 7b introduced in proximity to semiconductor substrate 1, side wall film 8b formed on the side of gate electrode 6b are provided. Gate electrode 6b is formed by patterning a laminated body of gate conductive film 4b and protective insulating film 5b.

Impurity diffusion layers 7a and 7b are formed by diffusing an N-type conductive impurity into semiconductor substrate 1. Side wall films 8a and 8b are formed of an insulating film. Gate electrodes 6a and 6b function as word lines WL. Impurity diffusion layer 7a functions as source and drain electrodes of MOS transistors in memory cell region 51. Impurity diffusion layer 7b functions as source and drain electrodes of MOS transistors in peripheral circuit region 52.

In peripheral circuit region 52, only the N-channel MOS transistor is shown as an example of the MOS transistor. However, an N-well layer may be formed in semiconductor substrate 1, and P-channel MOS transistor may be provided therein.

An example of a material of gate insulating films 3a and 3b is silicon oxide ($SiO_2$) film. Examples of materials of gate conductive films 6a and 6b include a polysilicon film including phosphorus or a tungsten (W) film or a tungsten silicide (WSi) film, or a laminated body formed by stacking at least two of these films. An example of material of protective insulating films 5a and 5b and side wall insulating films 8a and 8b is a silicon nitride ($Si_3N_4$) film.

First interlayer insulating film 9 is formed of an insulating film, such as a silicon oxide film, so as to cover gate electrodes 6a and 6b. Here, the upper surface of first interlayer insulating film 9 is polished by CMP (Chemical Mechanical Polishing) method, and the upper surface of first interlayer insulating film 9 is planarized.

Cell contact plugs 10a and 11a connected to impurity diffusion layer 7a of memory cell region 51 are formed of a conductive film, such as a polysilicon film including phosphorus. SAC method (Self Alignment Contact) using gate electrode 6a can be employed to form cell contact plug 11a. Peripheral contact plug 11b connected to impurity diffusion layer 7b in peripheral circuit region 52 is formed of a conductive film, such as a tungsten film.

In memory cell region 51, bit lines 12 connected to any one of the source and drain electrodes of the MOS transistor via cell contact plug 10a are formed. An example of a material of bit line 12 is a laminated body of tungsten nitride (WN) and tungsten (W).

While bit line 12 is formed, peripheral line 13, to which the source and drain electrodes of the MOS transistor are connected via peripheral contact plug 11b, is formed in peripheral circuit region 52. Although not shown, a contact plug connected to gate conductive film 4b in peripheral circuit region 52, and a wiring layer may be formed concurrently with peripheral line 13.

Second interlayer insulating film 14 is formed of an insulating film, such as a silicon oxide film, so as to cover bit line 12 and peripheral line 13. The upper surface of second interlayer insulating film 14 is polished and planarized by the CMP method. In memory cell region 51, capacitance contact plug 15 passing through second interlayer insulating film 14 and connected to cell contact plug 11a is formed of a conductive film, such as a tungsten film.

Pad 20 is provided on second interlayer insulating film 14 in memory cell region 51. Pad 22 of a conductive film is provided on second interlayer insulating film 14 in peripheral circuit region 52. Pads 20 and 22 are formed by patterning a laminated body having been formed by sequentially stacking a tungsten nitride (WN) film and a tungsten (W) film. Pad 20 is connected to capacitance contact plug 15.

Pads 22 in peripheral circuit regions 52 are arranged in compensation capacitance regions 53a and 53b where compensation capacitance elements 65 are provided. In contrast to pad 20 in memory cell region 51, pad 22 is formed as one large pattern to connect the lower electrodes of the capacitors for the compensation capacitance element to each other. In the following description on the manufacturing method, a case where only one block of the compensation capacitance element is arranged will be shown as a sectional view.

Stopper film 25 is provided so as to cover pads 20 and 22. Stopper film 25 is formed by stacking a silicon nitride film having a film thickness of about 40-100 nm using the LP-CVD (Low Pressure-Chemical Vapor Deposition) method or the ALD (Atomic Layer Deposition) method. Stopper film 25 functions as a stopper for preventing the chemical solution from penetrating below, the chemical solution being used in after-mentioned wet etching performed when making the crown electrodes.

Next, a subsequent step on the structure shown in FIG. 4 will be described with reference to FIG. 5. Third interlayer insulating film 26 having a film thickness of about 1-2 μm and support film 27 having a film thickness of about 50-150 nm are sequentially stacked on stopper film 25 shown in FIG. 4. Third interlayer insulating film 26 corresponds to a core insulating film.

Examples of a material of third interlayer insulating film 26 include a silicon oxide film or a BPSG film containing impurity, or a laminated body of these insulating films. A case where third interlayer insulating film 26 is formed of a silicon oxide film corresponds to the core oxide film. An example of a material of support film 27 is a silicon nitride film stacked using the LP-CVD method or the ALD method. Support film 27 has a function of supporting the electrodes that will not be destroyed during wet etching for forming the crown electrodes.

Figure 5:
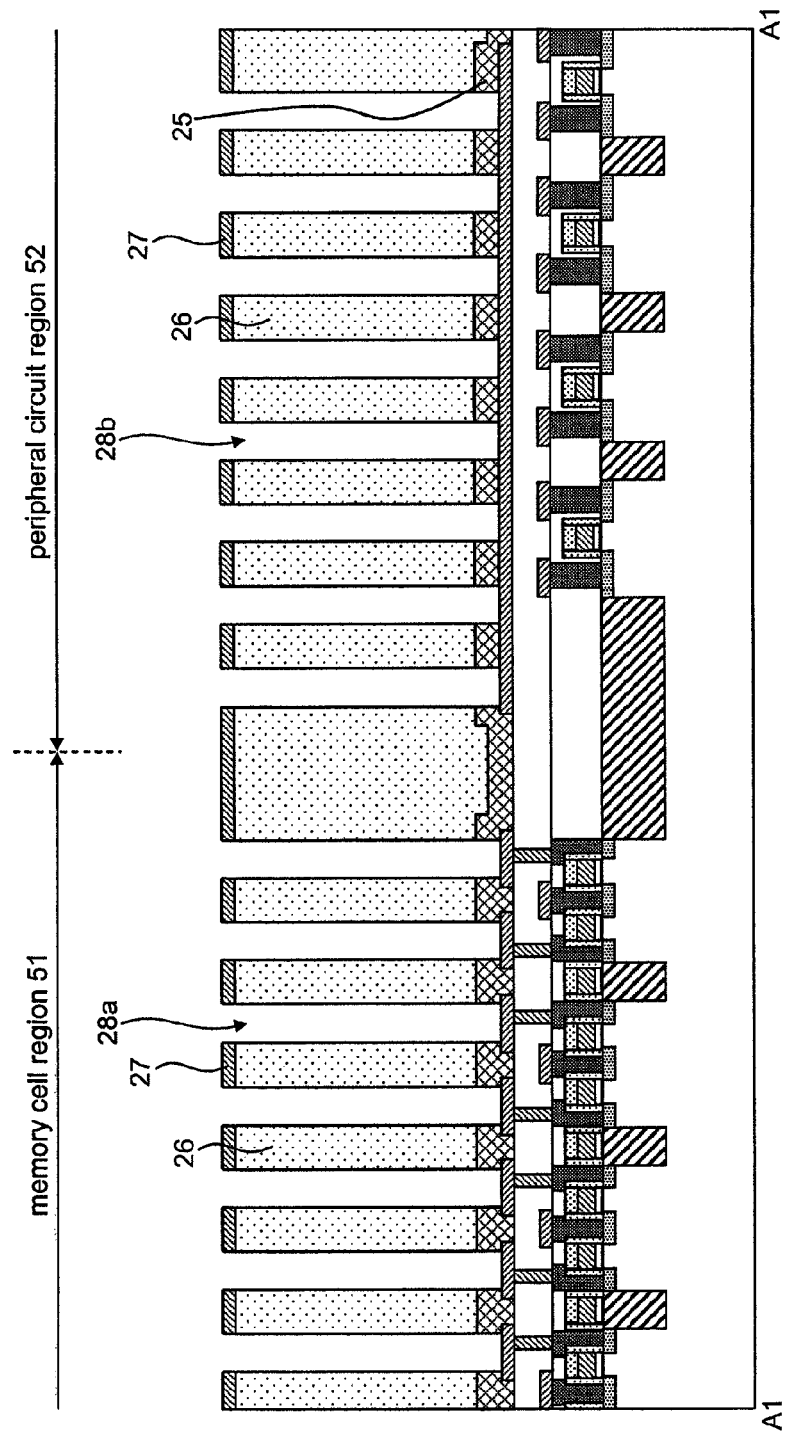
FIG. 5 is a sectional view of the primary part showing a step of manufacturing the semiconductor device of the first exemplary embodiment.

Subsequently, as shown in FIG. 5, anisotropic dry etching is selectively performed, and openings 28a and 28b penetrating support film 27, third interlayer insulating film 26 and stopper film 25 are formed. Opening 28a is formed in memory cell region 51, and opening 28b is formed in peripheral circuit region 52. A method using a resist mask of a lithography step has been known as an example of the method of selectively performing etching. A detailed description thereof is omitted.

Figure 6:
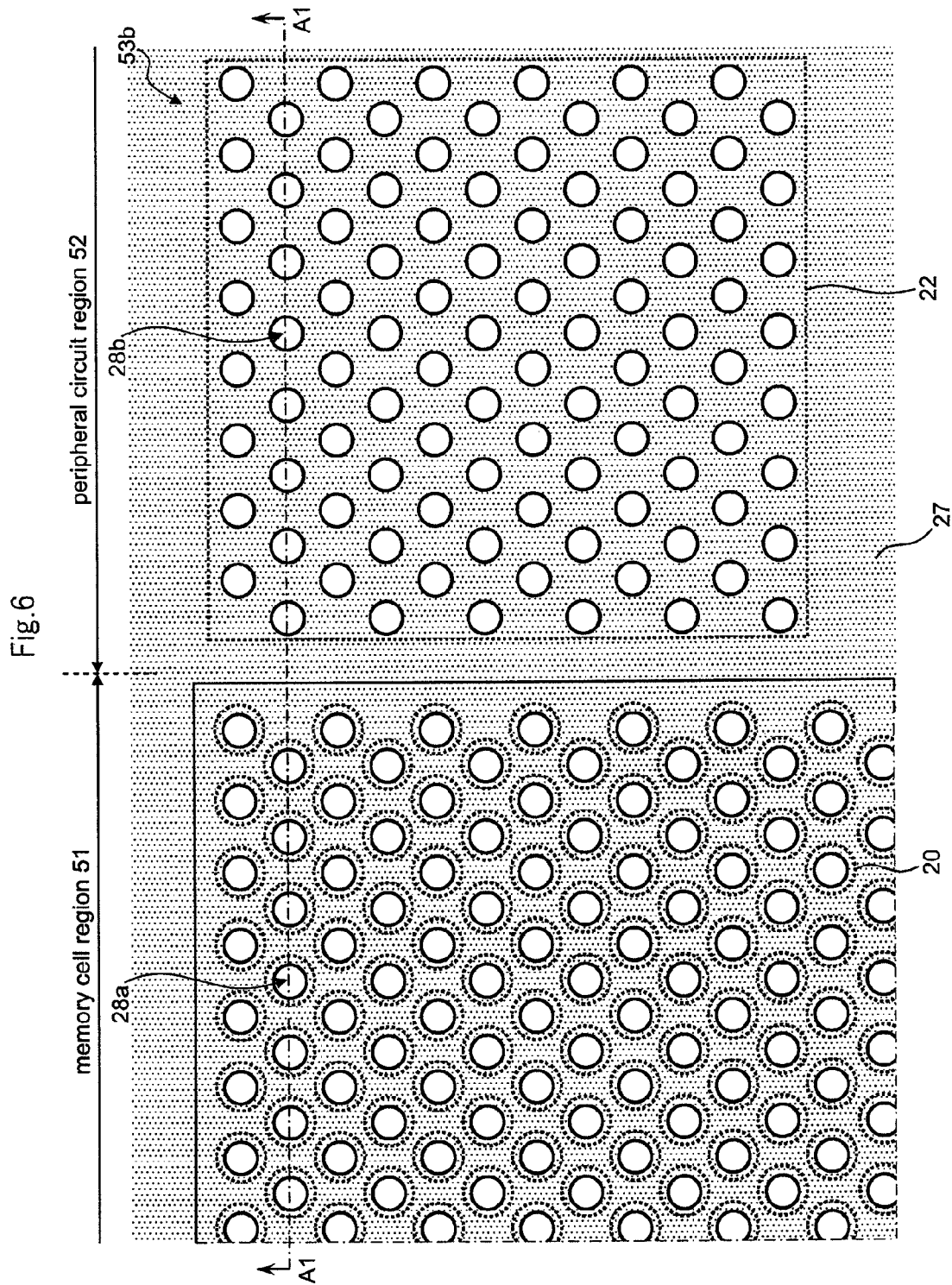
FIG. 6 is a plan view of the primary part showing a step of manufacturing the semiconductor device of the first exemplary embodiment.

FIG. 6 shows a plan view in which the memory cell region and the peripheral circuit region are viewed from above after forming the openings in the step described with reference to FIG. 5. A part taken along line A1-A1 shown in FIG. 6 corresponds to the section shown in FIG. 5.

Opening 28a in memory cell region 51 defines the position of the lower electrode of capacitor C1 used for memory cell 70. Opening 28b in peripheral circuit region 52 defines the position of the lower electrode of capacitor C2 used for compensation capacitance element 65. At the bottoms of openings 28a and 28b, the upper surfaces of respective pads 20 and 22 are exposed.

The film thickness of third interlayer insulating film 26 defines the heights of capacitors C1 and C2, which is reflected to capacitance. The thicker the film of third interlayer insulating film 26, the greater is the capacitance; however, processing of openings 28a and 28b becomes accordingly difficult. Thus, the film thickness of third interlayer insulating film 26 is preferably set such that the aspect ratios of openings 28a and 28b are about 15-25.

Referring to FIG. 6, in peripheral circuit region 52, openings 28b are provided for one large pad 22. In memory cell region 51, separated pads 20 are provided for respective individual openings 28a.

This exemplary embodiment shows a case where openings 28a and 28b are formed so as to have horizontal sections whose diameters are identical to each other. The diameters and the planar shapes of openings 28a and 28b are preferably identical to each other in processing viewpoint. However, even if the diameters or shapes of the openings in memory cell region 51 and peripheral circuit region 52 are different from each other, the present invention is applicable thereto.

Figure 7:
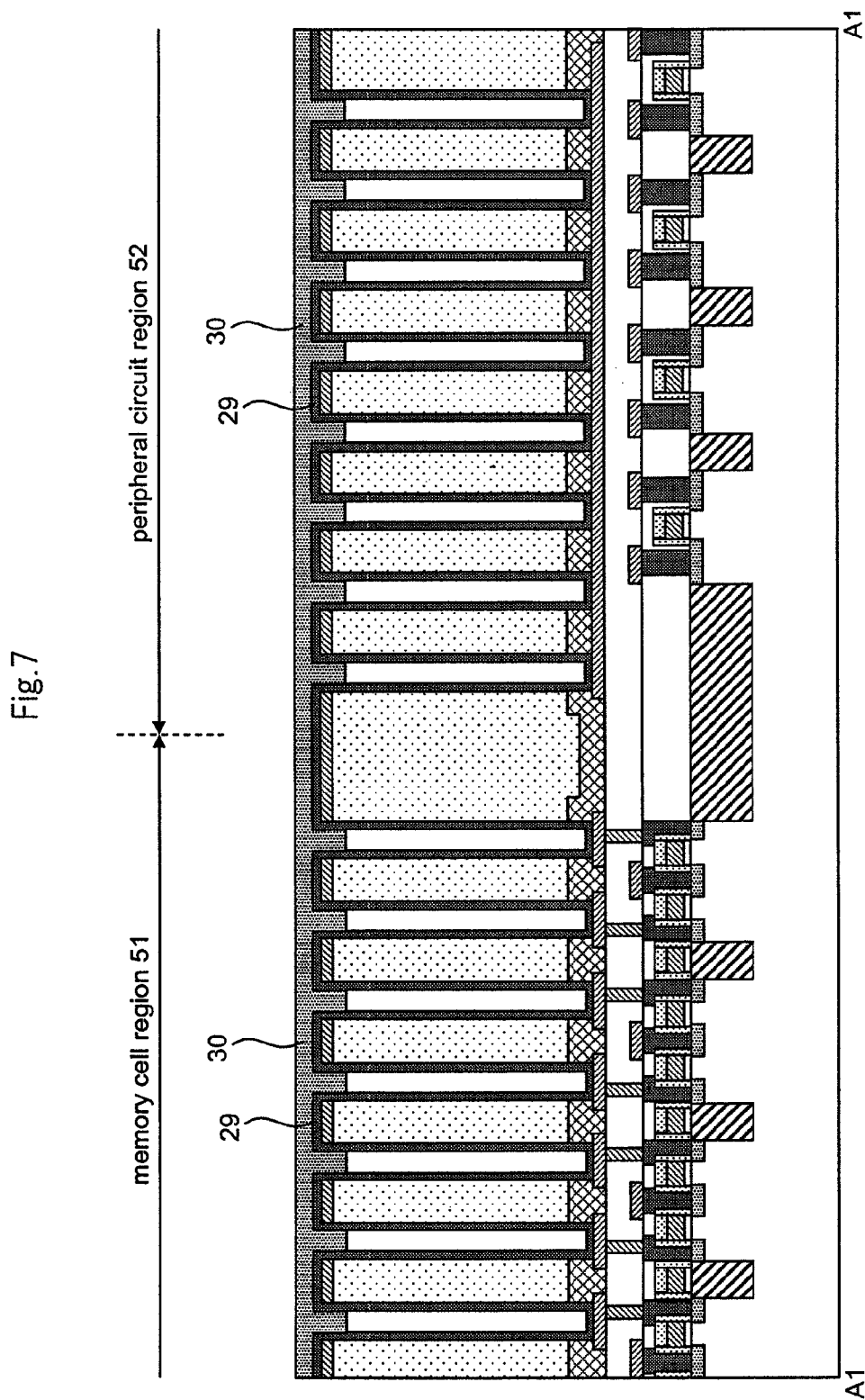
FIG. 7 is a sectional view of the primary part showing a step of manufacturing the semiconductor device of the first exemplary embodiment.

Next, as shown in FIG. 7, metal films are stacked into the structure shown in FIG. 5 using the CVD method, thereby forming lower electrode film 29 of capacitors. An example of a material of lower electrode film 29 is titanium nitride (TiN). Lower electrode film 29 is formed into a film thickness such that lower electrode film 29 does not completely fill the insides of openings 28a and 28b. For instance, in a case where the diameter of opening 28a is 80 nm, the film thickness of lower electrode film 29 is made to be about 10-20 nm.

Subsequently, cap insulating film 30, such as a silicon nitride (SiN) film, is formed on lower electrode film 29 using a film forming method with poor step coverage, such as the plasma CVD method. In openings 28a and 28b, cap insulating film 30 is embedded only in proximity to the top of the opening. This is because, in the case of forming cap insulating film 30 using the film forming method with poor step coverage, such as the plasma CVD method, on the opening processed according to a design rule after the generation in which the minimum processing dimension is 65 nm, the top end of the opening is blocked first and the film is not stacked into the opening. Since cap insulating film 30 is removed in a later step, there is no need to completely prevent the film from adhering to the inner walls of openings 28a and 28b.

Figure 8:
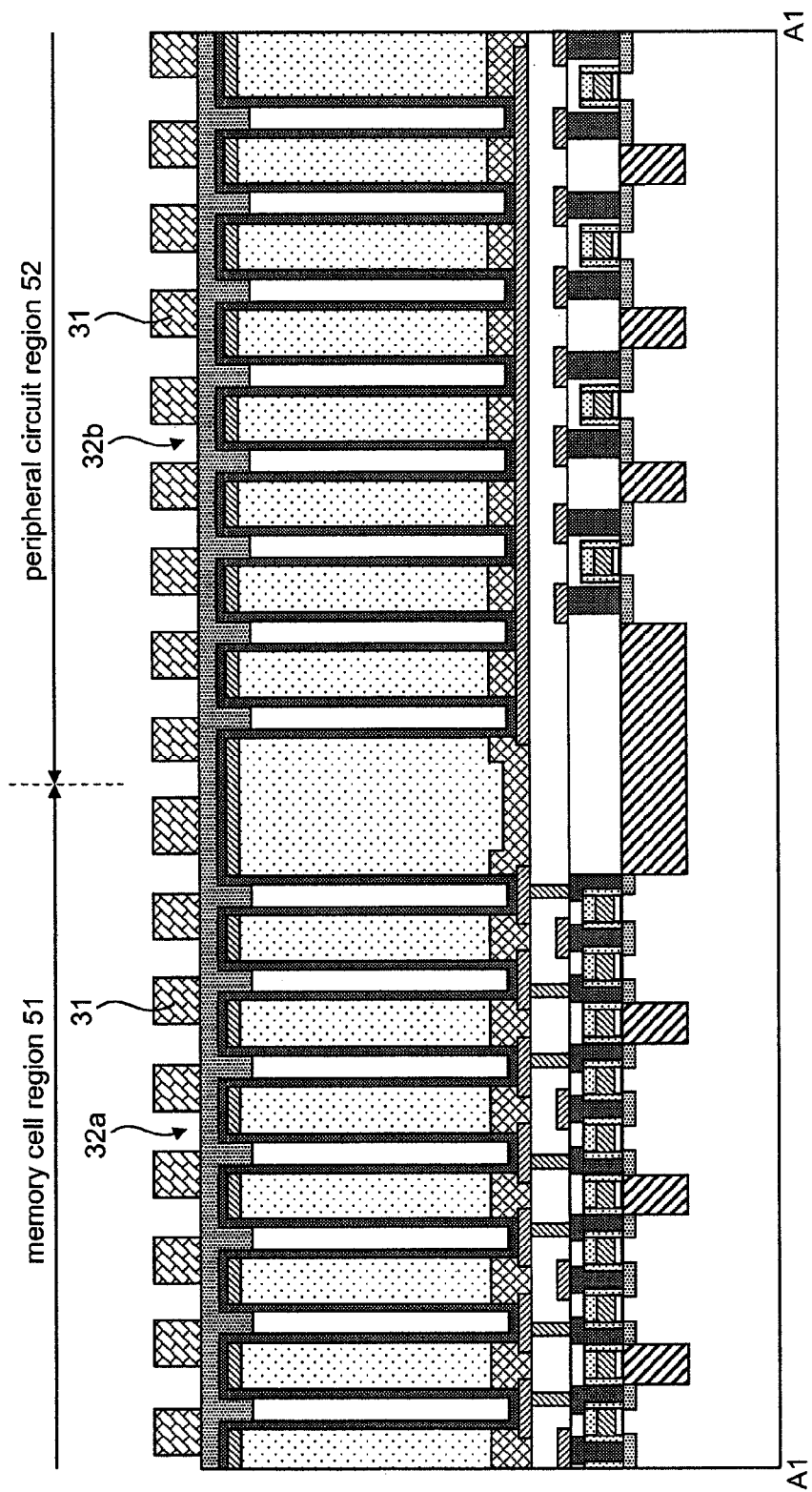
FIG. 8 is a sectional view of the primary part showing a step of manufacturing the semiconductor device of the first exemplary embodiment.

Next, as shown in FIG. 8, photoresist film 31 having openings is formed on cap insulating film 30. Photoresist film 31 includes opening patterns 32a and 32b in memory cell region 51 and peripheral circuit region 52, respectively. The positions of opening patterns 32a and 32b correspond to positions at which a window pattern for letting chemical solution penetrate during the after-mentioned wet etching will be formed to cap insulating film 30.

Here, cap insulating film 30 is formed prior to photoresist film 31, thereby preventing photoresist film 31 from penetrating into openings 28a and 28b. This facilitates pattern processing on photoresist film 31 using exposure, and also facilitates removing photoresist film 31 after the processing process because openings 28a and 28b are not filled with photoresist film 31.

Figure 9:
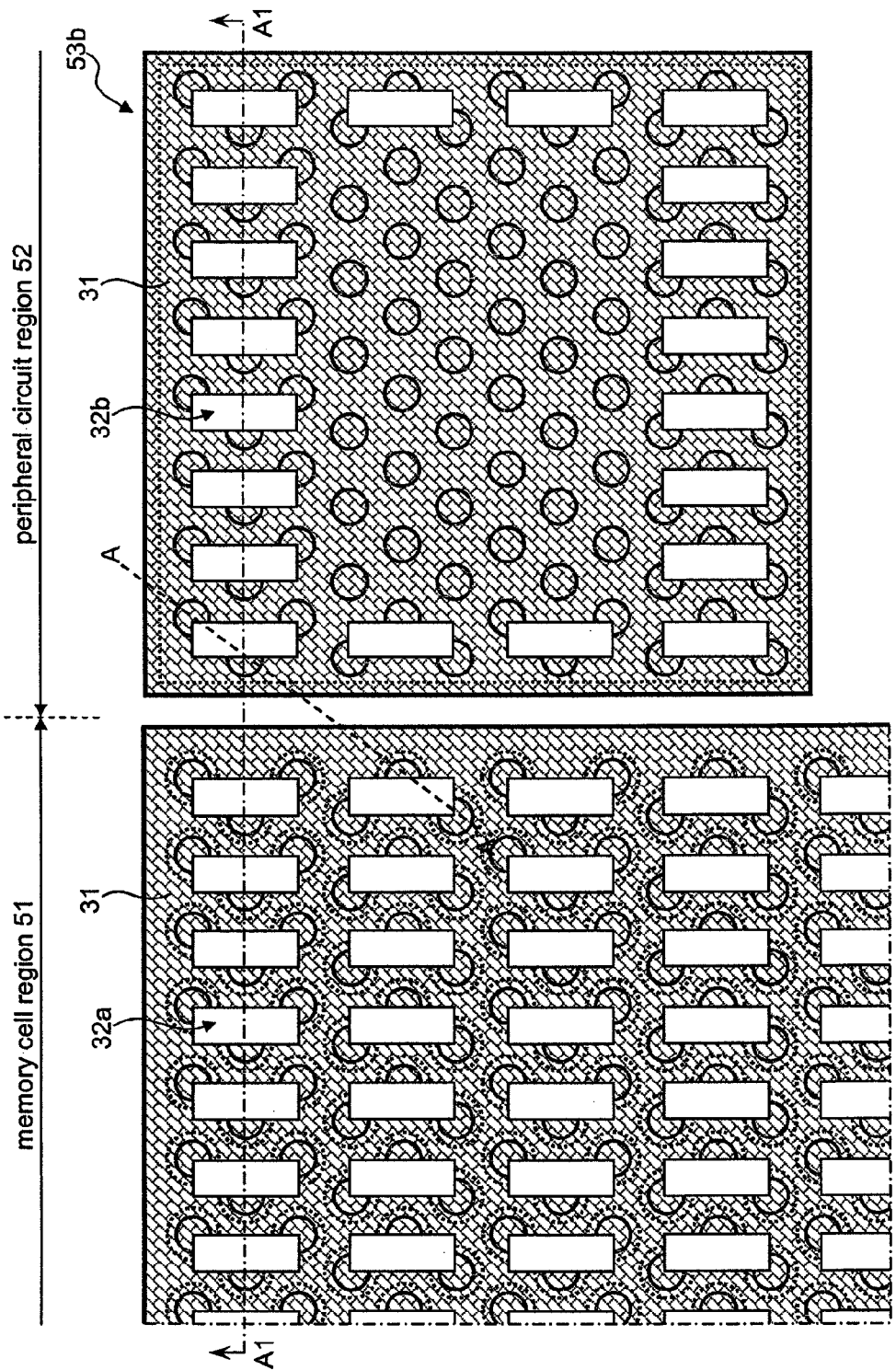
FIG. 9 is a plan view of the primary part showing a step of manufacturing the semiconductor device of the first exemplary embodiment.

FIG. 9 is a plan view in which the memory cell region and the peripheral circuit region are viewed from above after forming the photoresist film in the step described with reference to FIG. 8. A part taken along line A1-A1 shown in FIG. 9 corresponds to the section shown in FIG. 8.

In this exemplary embodiment, opening patterns 32a and 32b are rectangular patterns arranged in parallel in memory cell region 51 and compensation capacitance region 53b, respectively. Photoresist film 31 is formed so as to cover only memory cell region 51 and compensation capacitance region 53b. In peripheral circuit region 52, parts other than compensation capacitance region 53b are not covered with photoresist film 31.

Opening patterns 32a and 32b shown in FIG. 9 are only examples. For instance, the opening patterns may be formed such that the longitudinal directions of the opening patterns match with each other in the direction of line A-A' shown in FIG. 9.

Figure 10:
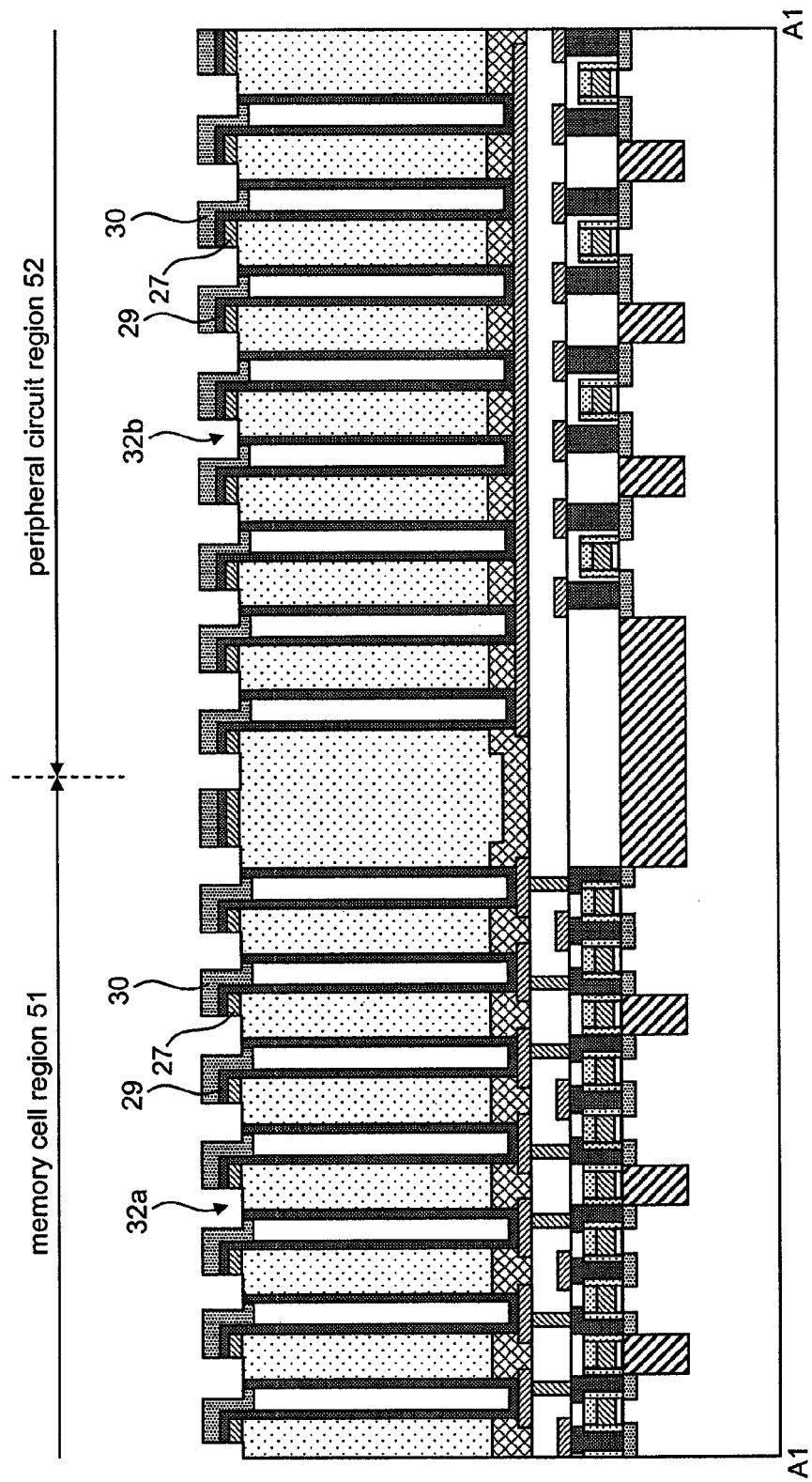
FIG. 10 is a sectional view of the primary part showing a step of manufacturing the semiconductor device of the first exemplary embodiment.

Next, as shown in FIG. 10, parts of cap insulating film 30, lower electrode film 29 and support film 27 that are not covered with photoresist film 31 are removed by anisotropic dry etching using photoresist film 31 as a mask. Accordingly, the window pattern (openings) is formed on parts of support film 27 corresponding to opening patterns 32a and 32b. Support film 27 remains so as to connect the electrodes of the individual capacitors to each other. Subsequently, photoresist film 31 is removed by the plasma ashing method.

Figure 11:
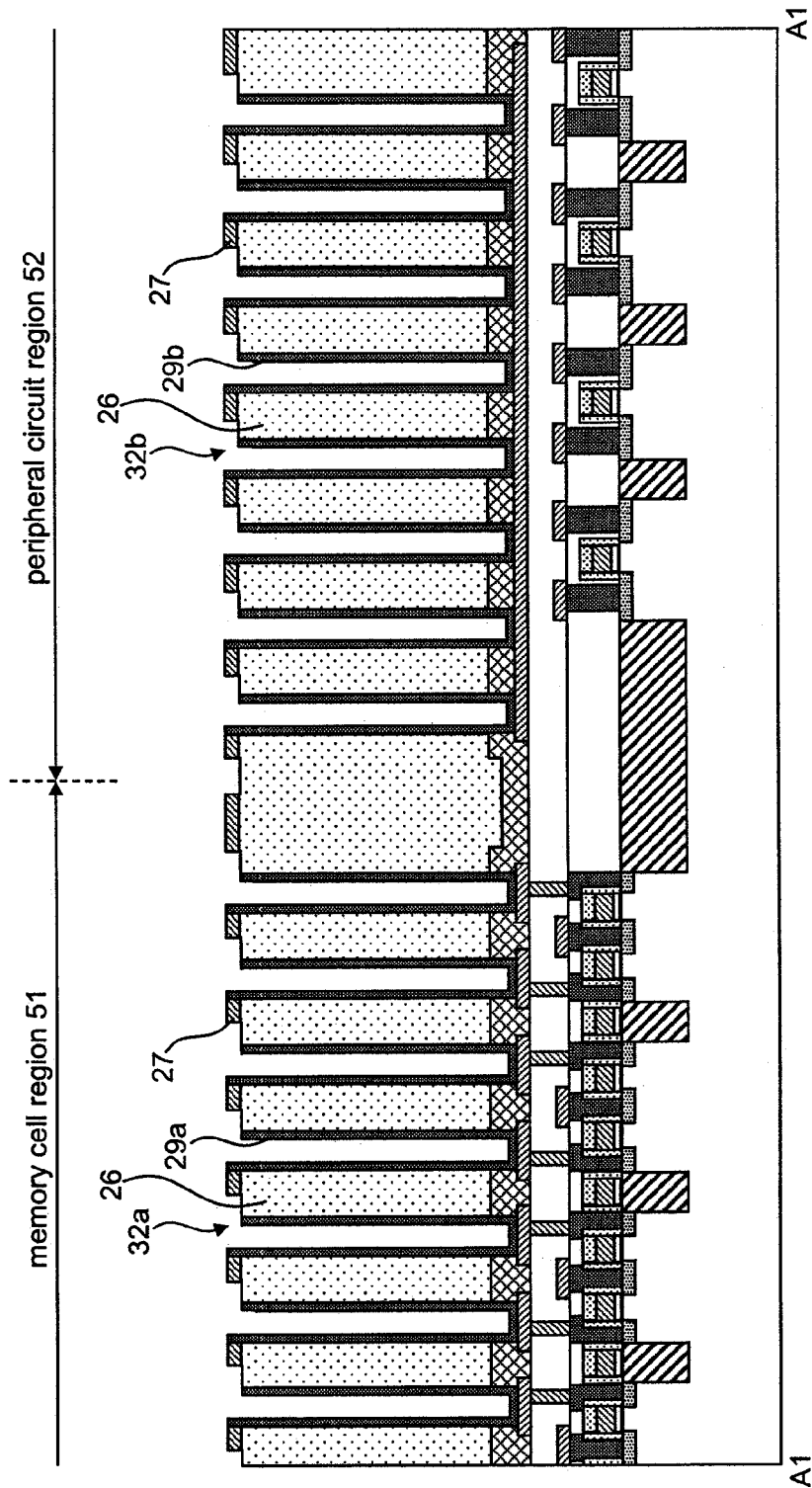
FIG. 11 is a sectional view of the primary part showing a step of manufacturing the semiconductor device of the first exemplary embodiment.

Next, as shown in FIG. 11, remaining cap insulating film 30 and lower electrode film 29 disposed at the outsides of openings 28a and 28b are removed by dry etching. Here, in a case where the aspect ratios of openings 28a and 28b are high (e.g., at least an aspect ratio of 15), lower electrode film 29 on support film 27 can be removed by dry etching without damaging lower electrode film 29 at the bottoms of the openings.

Figure 12:
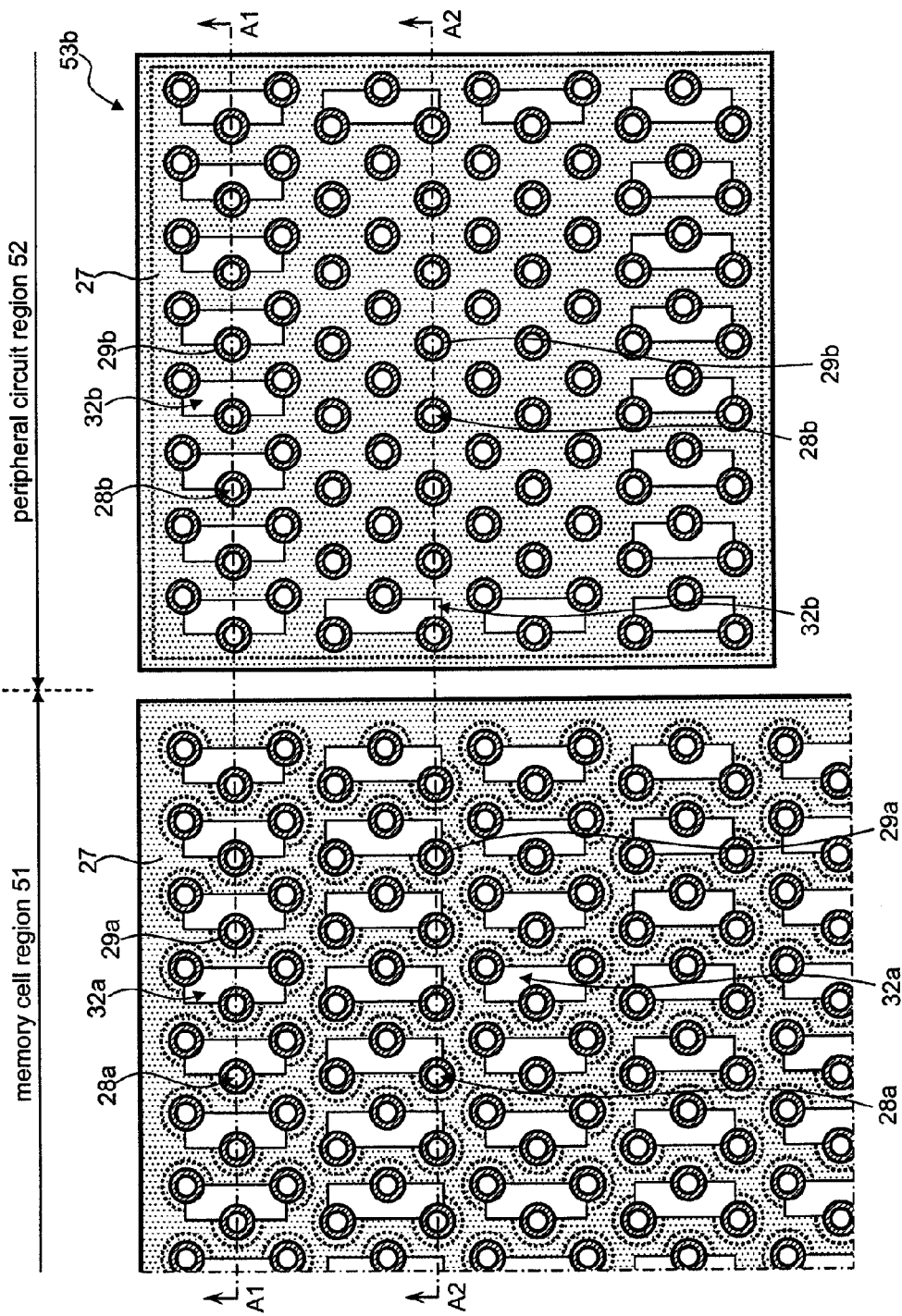
FIG. 12 is a plan view of the primary part showing a step of manufacturing the semiconductor device of the first exemplary embodiment.

FIG. 12 shows a plan view in which the memory cell region and the peripheral circuit region are viewed from above after dry etching in the step described with reference to FIG. 11.

As shown in FIG. 12, in memory cell region 51, lower electrodes 29a covering the inner walls of openings 28a are formed, and in peripheral circuit region 52, lower electrodes 29b covering the inner walls of openings 28b are formed. In peripheral circuit region 52, opening patterns 32b are arranged along peripheral sides of support film 27. Area density of opening patterns 32b at a peripheral portion of support film 27 is lager than area density of opening patterns 32b at a center portion of support film 27.

Support film 27 remaining in memory cell region 51 comes into contact with the outer walls of lower electrode 29a, and functions as a supporter that integrally supports the individual lower electrodes during after-mentioned wet etching. Support film 27 remaining in compensation capacitance region 53b in peripheral circuit region 52 comes into contact with the outer walls of lower electrodes 29b, and functions as a supporter that integrally supports the individual lower electrodes during the after-mentioned wet etching.

Figure 13:
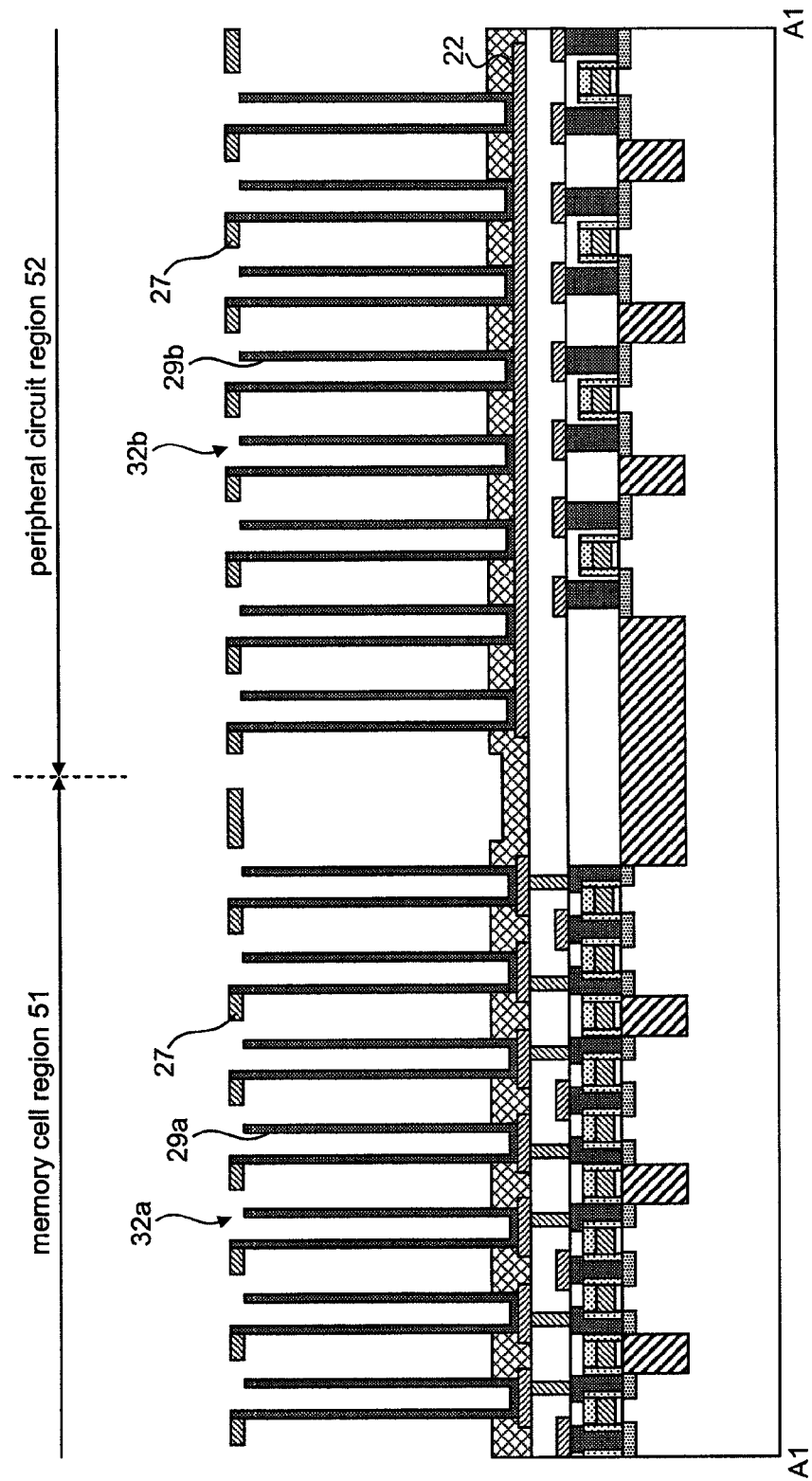
FIG. 13 is a sectional view that corresponds to a part taken along line A1-A1 shown in FIG. 12.

Next, wet etching is performed on the structure shown in FIG. 11 using diluted hydrofluoric acid (hydrofluoric acid: HF) as the chemical solution. FIG. 13 corresponds to a section of the part taken along line A1-A1 shown in FIG. 12 after the wet etching. As shown in FIG. 13, in memory cell region 51, third interlayer insulating film 26 is removed. As a diluted hydrofluoric acid solution, in view of the need for reducing the amount of time required for wet etching, a solution of 49 wt % (weight %) is preferably used. The diluted hydrofluoric acid solution of this concentration corresponds to an undiluted hydrofluoric acid solution supplied from a material maker for industrial use, and is usable for the wet etching processing as is.

In wet etching, a silicon nitride film formed by the LP-CVD method or the ALD method is resistant to hydrofluoric acid. This can prevent the chemical solution from penetrating into layers lower than stopper film 25. This can in turn prevent elements, such as MOS transistors, that have already been formed in memory cell region 51 and peripheral circuit region 52, from being damaged.

In the step described with reference to FIG. 7, the silicon nitride film is formed as cap insulating film 30 by the plasma CVD method. Accordingly, cap insulating film 30 is a film that is not resistant to hydrofluoric acid. Therefore, in a case where cap insulating film 30 remains on the surfaces of lower electrodes 29a and 29b, cap insulating film 30 is completely removed in the wet etching-step.

As shown in FIG. 13, the outer walls of lower electrodes 29a formed in memory cell region 51 are exposed and the crown electrodes are formed, by wet etching. In this case, individual lower electrodes 29a are supported by support film 27, and configured as one block, thereby preventing the individual lower electrodes from being destroyed. In memory cell region 51, typically at least one hundred thousand lower electrodes 29a are arranged in one mat in an integrated manner, thereby providing a sufficient supporting strength as a whole.

As shown in FIG. 13, the outer walls of lower electrode 29b formed in compensation capacitance region 53b in peripheral circuit region 52 are also exposed and crown electrodes are formed, as with lower electrodes 29a.

Figure 14:
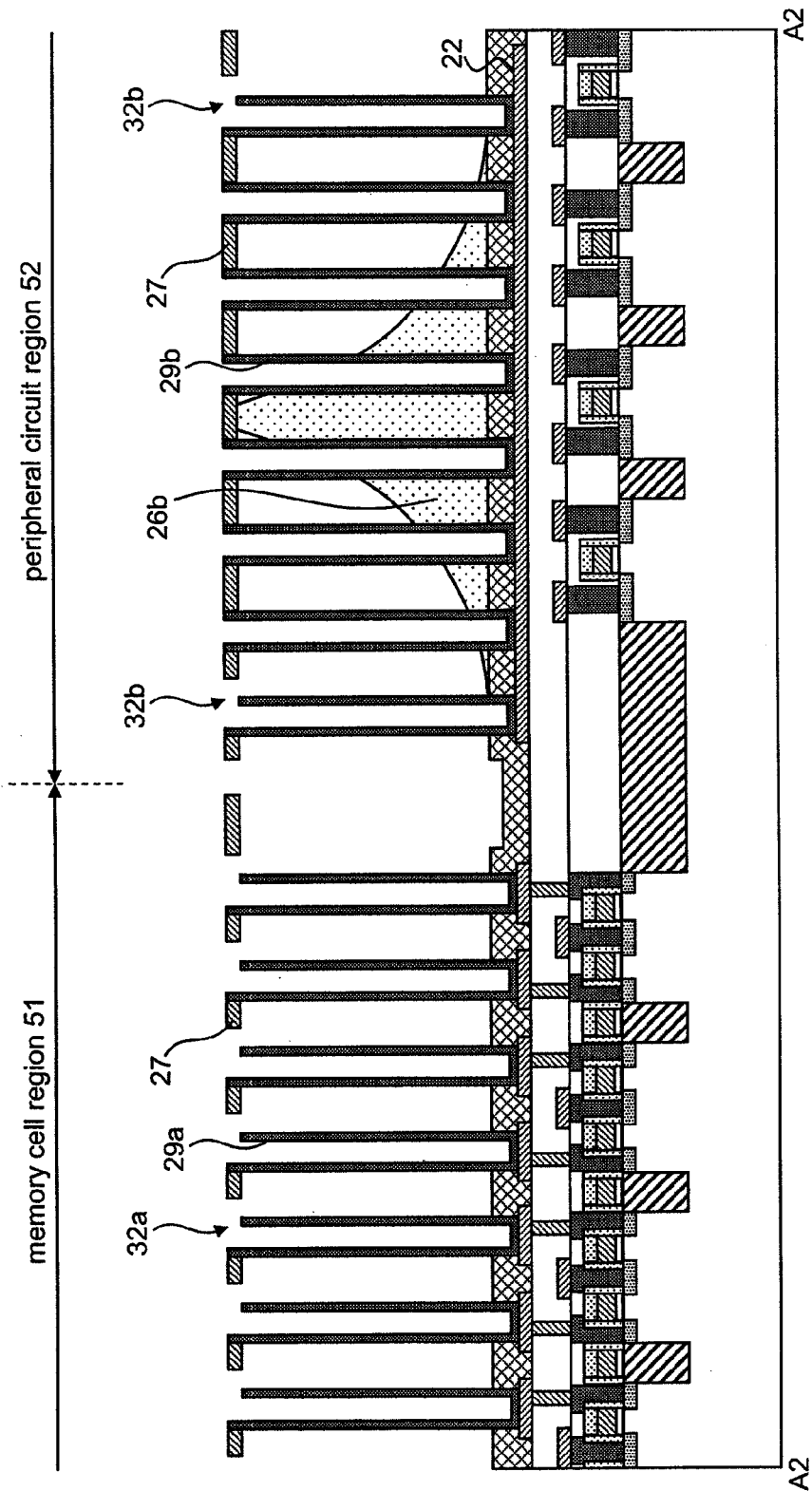
FIG. 14 is a sectional view that corresponds to a part taken along line A2-A2 shown in FIG. 12.

Here, referring to FIG. 14, characteristics of a method of manufacturing the semiconductor device of this exemplary embodiment are described. The method of manufacturing the semiconductor device of this exemplary embodiment is characterized by the step of removing core oxide film (third interlayer insulating film), that has already been described with reference to FIGS. 8 to 13.

As can be seen from FIG. 11, at opening patterns 32a and 32b made on support film 27, third interlayer insulating film 26 corresponding to the core oxide film is partially exposed. In this state, wet etching is applied to support film 27, etchant works on third interlayer insulating film 26 exposed to at opening patterns 32a and 32b, and thereby third interlayer insulating film 26 is removed. In other words, for the wet etching on third interlayer insulating film 26, support film 27 functions as an etching mask. After the third interlayer insulating film 26 is removed, support film 27 remains. Support film 27 supports lower electrodes 29a and 29b. Here, according to the manufacturing method of this exemplary embodiment, as shown in FIG. 12, in compensation capacitance region 53b, support film 27 is patterned such so as not to form opening pattern 32b at the center of support film 27 but to form opening pattern 32b at a peripheral part of the mat.

FIG. 14 shows a sectional view taken along line A2-A2 that crosses the central part of the mat in compensation capacitance region 53b shown in FIG. 12 that is viewed in the direction of the arrow after the wet etching. FIG. 14 is a sectional view taken along line A2-A2 at a stage that occurs after third interlayer insulating film 26 has been removed by wet etching, that is, a stage that is the same as the one in FIG. 13.

As described above, in the manufacturing method of this exemplary embodiment, opening pattern 32b is not formed in the central part of the mat in compensation capacitance region 53b, and the upper surface of third interlayer insulating film 26 at and around the center is covered with support film 27. Accordingly, third interlayer insulating film 26 in compensation capacitance region 53b where opening pattern 32b is formed on support film 27 is exposed only at the peripheral region but is not exposed at and around the center. Therefore, in the step of wet etching on third interlayer insulating film 26, etching gradually advances from the peripheral region of third interlayer insulating film 26 exposed at opening pattern 32b on support film 27 in the direction toward the central part of the mat. However, third interlayer insulating film 26 is covered with support film 27 as the etching mask at the central part of the mat. Accordingly, the part is resistant to being removed due to working of the mask by support film 27.

As a result, at the time of completion of the etching in which third interlayer insulating film 26, in the entire memory cell region 51 where opening pattern 32a is formed, and third interlayer insulating film 26 at opening pattern 32b in the peripheral part of the mat in compensation capacitance region 53b, are removed, third interlayer insulating film 26b remains below the central part of the mat in compensation capacitance region 53b.

In the step of etching on third interlayer insulating film 26, third interlayer insulating film 26 is isotropically removed using wet etching by chemical solution. Accordingly, as shown in FIG. 14, in compensation capacitance region 53b, third interlayer insulating film 26 is gradually removed from the upper surface at the peripheral part of the mat, third interlayer insulating film 26b remains such that the section in the stacking direction of third interlayer insulating film 26 is shaped like a mountain. In other words, third interlayer insulating film 26b in compensation capacitance region 53b remains below supporting nitride film 27 such that the bottom is wider than the top and comes into contact with pad 22 at an area wider than the top.

As described above, in the step of removing third interlayer insulating film 26 in the manufacturing method of this exemplary embodiment, the opening pattern of support film 27 is adjusted in compensation capacitance region 53b with the small mat, and thereby third interlayer insulating film 26 under the central part of the mat is protected from etching. This allows third interlayer insulating film 26b to be left such that the bottom widely conies into contact with pad 22. Accordingly, even in a case where the number of lower electrodes 29b is small and where the contact area of the lower layers of the lower electrodes 29b comes into contact with the lower layer is small, intimate contact with the lower layer is increased due to third interlayer insulating film 26b that supports lower electrodes 29b at the lower parts. As a result, mat skipping, that is a concern in compensation capacitance region 53b where the contact area between lower electrode 29 and pad 22 is small after the third interlayer insulating film 26 is removed, can be prevented.

According to this exemplary embodiment, an advantageous effect can be acquired in which the intimate contact of lower electrodes 29b with the lower layer is increased by adjusting the opening pattern of the support film without adding a special step of patterning third interlayer insulating film 26.

Figure 15:
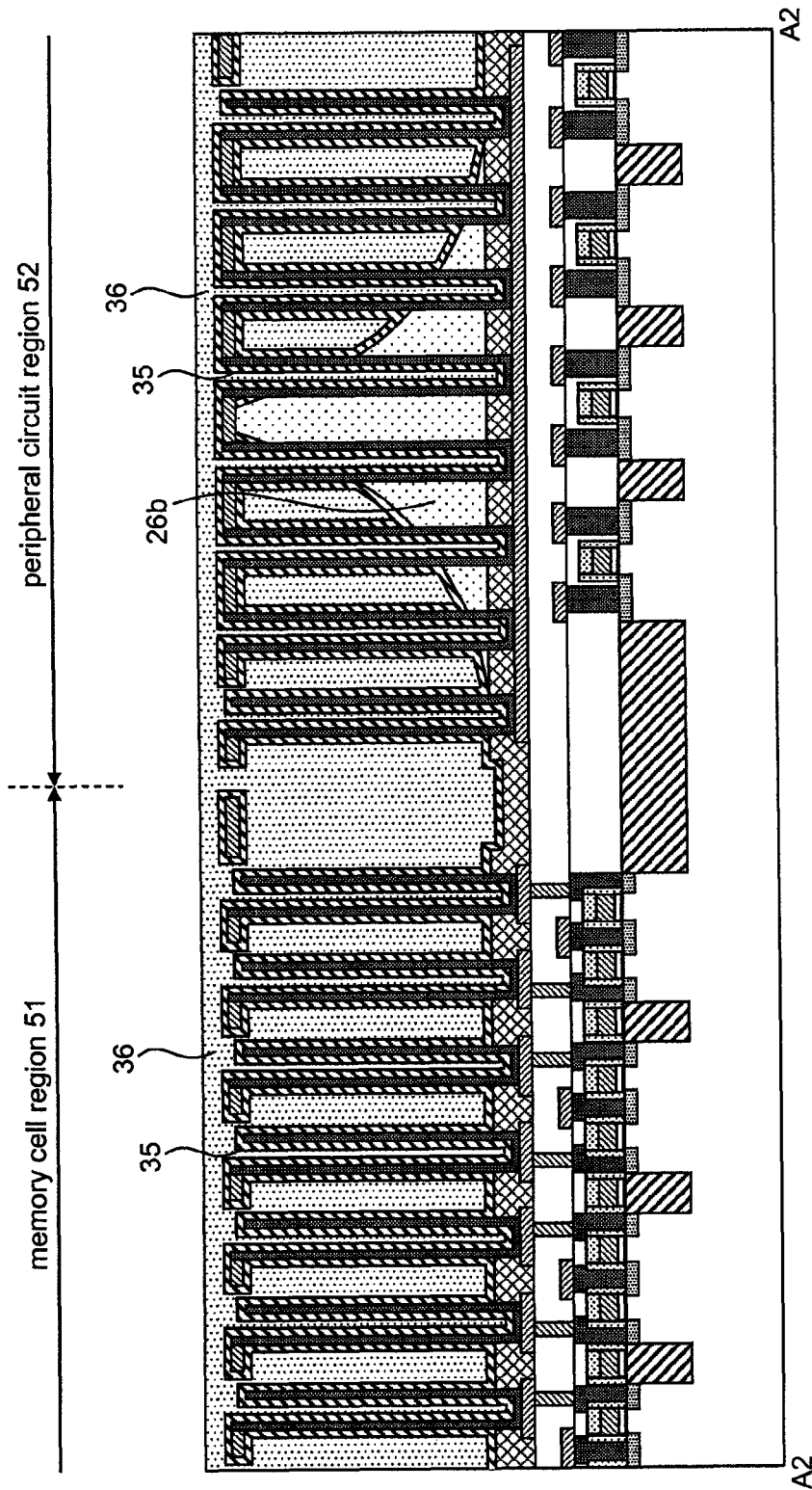
FIG. 15 is a sectional view of a primary part showing a step of manufacturing the semiconductor device of the first exemplary embodiment.

Next, after the steps described with reference to FIGS. 13 and 14, as shown in FIG. 15, capacitance insulating film 35 that has a film thickness of about 6-10 nm is formed so as to cover the exposed surfaces of lower electrodes 29a and 29b.

FIG. 15 is a sectional view that corresponds to a part taken along line A2-A2 shown in FIG. 12.

Examples of the material of capacitance insulating film 35 include a high-dielectric of zirconium oxide ($ZrO_2$) or hafnium oxide ($HfO_2$) or aluminum oxide ($Al_2O_3$) and the like, or a laminated body formed by stacking at least two films composed of these compounds. The ALD method can be used to form capacitance insulating film 35. After the capacitance insulating film 35 is formed, upper electrode film 36 is formed so as to cover the surface of capacitance insulating film 35.

When upper electrode 36 is formed, the gaps between the individual lower electrodes are required to be filled with upper electrodes 36. Accordingly, upper electrodes 36 are formed into a laminated structure, which will be described as follows.

As the material of the lowest layer of upper electrode 36, a metal film of titanium nitride (TiN) or the like is formed into a film thickness of 5-10 nm. In the step of forming the metal film for the lowest layer, gaps remain between the individual lower electrodes. Subsequently, a polysilicon film containing an impurity is formed, thereby filling the gaps that remain between the individual lower electrodes with the polysilicon film.

The polysilicon film is stacked as a film that has excellent step coverage using the LP-CVD method to form a polysilicon film. This allows the gaps that remain between the individual lower electrodes to be completely filled with polysilicon film. In FIG. 12, polysilicon film is formed via opening patterns 32a and 32b even on the part covered with support film 27, thereby filling the gaps between the lower electrodes.

As the impurity doped into the polysilicon film, phosphorus, boron or the like can be employed. The electrical resistance of the polysilicon film can be reduced by adopting N or P conductive type as the polysilicon film. Further, an element other than silicon may be added to the polysilicon film as an impurity.

After the polysilicon film is used to fill the gaps between the individual lower electrodes, a metal film, such as of tungsten, that has a film thickness of about 70-100 nm may be stacked on the polysilicon film. As a material of the metal film used for the lowest layer of upper electrode 36, a metal (e.g., ruthenium etc.) other than titanium nitride may be employed. The metal film used for the lowest layer of upper electrode 36 may be selected according to electrical characteristics required for the capacitor to be formed.

In this exemplary embodiment, as shown in FIG. 15, third interlayer insulating film 26b remains in compensation capacitance region 53b. Accordingly, capacitance insulating film 35 and upper electrode film 36 are not formed on lower electrodes 29 that is covered with third interlayer insulating film 26b, but are formed on the surface of third interlayer insulating film 26b instead. As shown in FIG. 15, remaining third interlayer insulating film 26b is formed into a convex shape. Accordingly, at the peripheral part of compensation capacitance region 53b, capacitors C2 are formed into shapes that are equivalent to those of capacitors C1 in memory cell region 51. However, in a region from the peripheral part to the central part, capacitors C2 that have distorted shapes and heights that are different from those of capacitors C1 are formed. As a result, compensation capacitance element 65 including capacitors C2 have a shape where the center is concave. Compensation capacitance element 65 with this structure is referred to as a concave capacitor.

Third interlayer insulating film 26b thus remains in the convex shape in compensation capacitance region 53b, and a part of the crown capacitors are not formed into shapes analogous to those in memory cell region 51, thereby allowing compensation capacitance element 65 to be formed into the concave shape. However, in compensation capacitance element 65, it is sufficient that capacitors C2 that are connected to pad 22, that becomes the mat, attain the desired capacitance value as a whole. Accordingly, from the peripheral part to the central part of compensation capacitance region 53b, an amount of reduction in capacitance due to capacitors C2 having capacitances smaller than those of capacitors C1 can be compensated for by increasing the number of cylinders.

In the semiconductor device of this exemplary embodiment, the section of third interlayer insulating film in the stacking direction has a mountain shape where the bottom is wider than the top. Accordingly, even in the compensation capacitance region with the small mat, the third interlayer insulating film that supports the lower parts of the cylinder-type lower electrodes increases the intimate contact, thereby preventing the lower electrode pattern from being peeled off.

(Second Exemplary Embodiment)

In the first exemplary embodiment, the description has been made using the case of adopting the support film as the mask; in the support film, opening patterns 32b are arranged in proximity to the peripheral part of compensation capacitance region 53b. In this exemplary embodiment, advantageous effects that are analogous to those of the first exemplary embodiment are attained using a mask that is different from that in the first exemplary embodiment. In this exemplary embodiment, detailed description on analogous points of the structure and the manufacturing method of the semiconductor device described in the first exemplary embodiment is omitted. Points that are different from those of first exemplary embodiment will be described in detail.

EXAMPLE 1

This Example is a case in which the opening pattern in compensation capacitance region 53b on support film 27 described in the first exemplary embodiment is not formed.

Figure 16:
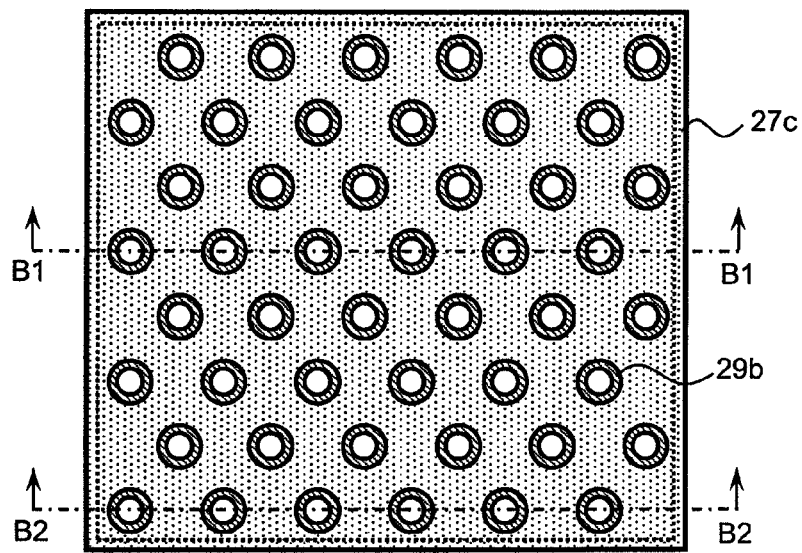
FIG. 16 is a plan view showing an example of a support film of a second exemplary embodiment.
Figure 17:
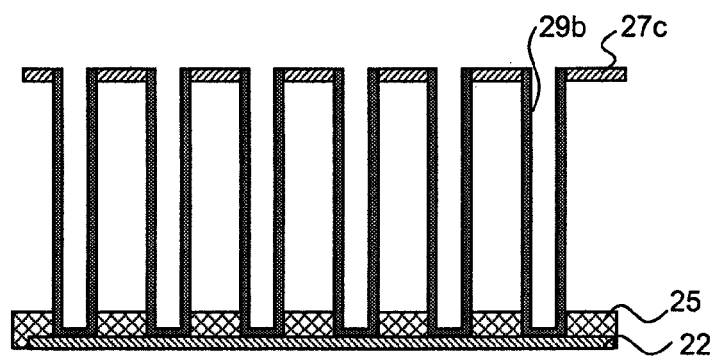
FIG. 17 is a sectional view that corresponds to a part taken along line B2-B2 shown in FIG. 16.
Figure 18:
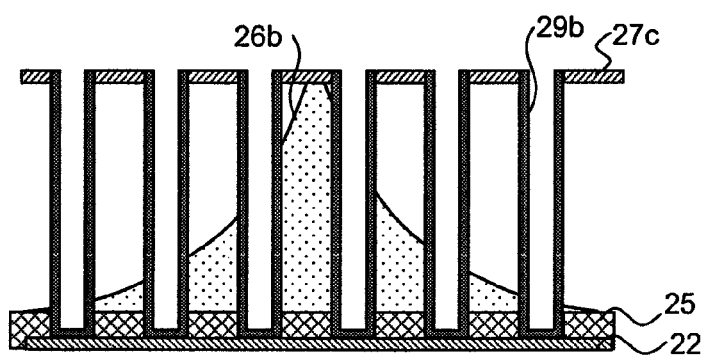
FIG. 18 is a sectional view that corresponds to a part taken along line B1-B1 shown in FIG. 16.

FIG. 16 is a plan view showing an example of a support film in this Example. FIG. 17 is a sectional view that corresponds to a part taken along line B2-B2 shown in FIG. 16. FIG. 18 is a sectional view that corresponds to a part taken along line B1-B1 shown in FIG. 16.

In FIGS. 16 to 18, illustration of memory cell region 51 is omitted. FIGS. 17 and 18 correspond to sections of FIG. 14 described in the first exemplary embodiment, and show a structure at and above pad 22; illustration of the other structures is omitted.

As shown in FIG. 16, the planar pattern of support film 27c is a little larger than pad 22 in compensation capacitance region 53b and this is analogous to the first exemplary embodiment. In this Example, the opening pattern is not formed on support film 27c.

Next, a case of wet etching on third interlayer insulating film 26 using support film 27c will be described.

When wet etching is performed on third interlayer insulating film 26 using support film 27c as a mask, a chemical solution gradually penetrates from the peripheral part to the central part so as to infiltrate around individual lower electrodes 29b. Accordingly, etching advances from the peripheral part to the inner part of compensation capacitance region 53b. The etching process is stopped when third interlayer insulating film 26 has been removed at the memory cell region, not shown.

After completion of the etching process, at the part of line B2-B2 in FIG. 16, as shown in FIG. 17, third interlayer insulating film 26 will have been removed. On the other hand, at the part of line B1-B1 in FIG. 16, as shown in FIG. 18, third interlayer insulating film 26b remains in a convex shape.

According to this example, in the step of removing third interlayer insulating film 26, etching on third interlayer insulating film 26 from above is protected, and third interlayer insulating film 26 is laterally etched in an isotropic manner, thereby enabling third interlayer insulating film 26b to be left such that the bottom is wider than the top. Accordingly, also in this Example, as with the first exemplary embodiment, third interlayer insulating film 26b improves the intimate contact of lower electrodes 29b, thereby preventing lower electrodes 29b from being peeled off in the cleaning step and the like.

EXAMPLE 2

This Example is a case of forming opening pattern 32b only at and around the center of compensation capacitance region 53b on support film 27 that has been described in the first exemplary embodiment.

Figure 19:
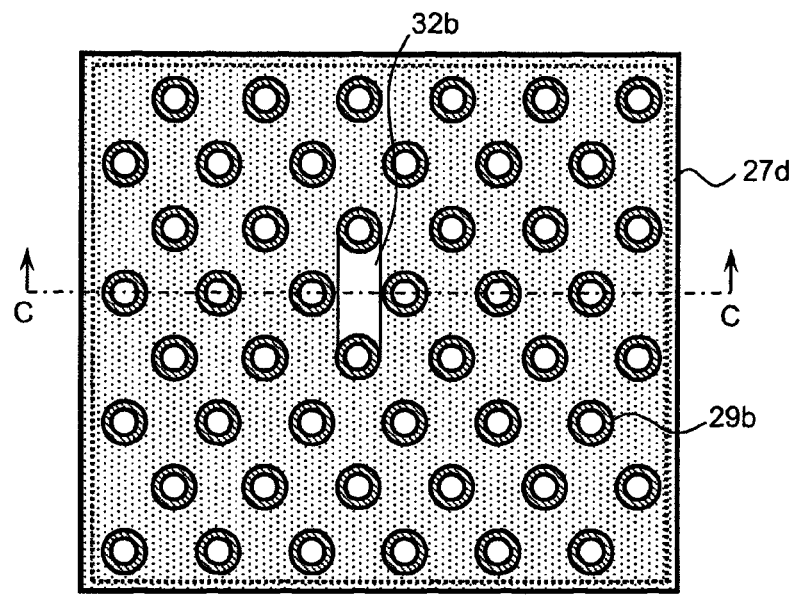
FIG. 19 is a plan view showing another example of a support film of the second exemplary embodiment.
Figure 20:
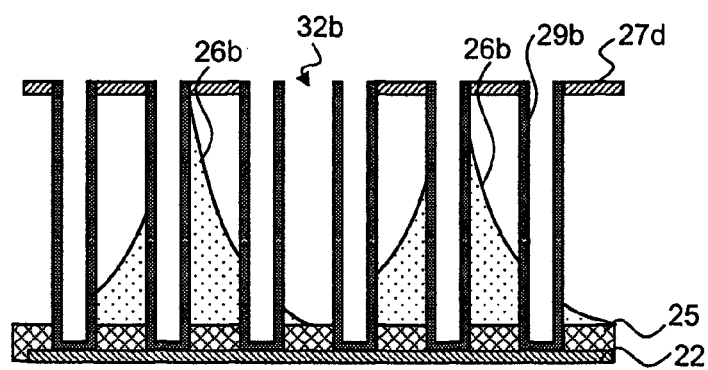
FIG. 20 is a sectional view that corresponds to a part taken along line C-C shown in FIG. 19.

FIG. 19 is a plan view showing an example of a support film in this Example. FIG. 20 is a sectional view that corresponds to a part taken along line C-C shown in FIG. 19. Also in this example, in FIGS. 19 and 20, showing memory cell region 51 has been omitted. Further, FIG. 20 corresponds to the section of FIG. 14 described in the first exemplary embodiment, and illustrates the structure at and above pad 22; showing the other structures in the diagram has been omitted.

As shown in FIG. 19, opening pattern 32b is formed at and around the center of support film 27d. The planar pattern of support film 27d is a little larger than pad 22 in compensation capacitance region 53b and this is analogous to Example 1 of this exemplary embodiment and the first exemplary embodiment.

Next, a case of wet etching on third interlayer insulating film 26 that uses support film 27d will be described.

When wet etching is performed on third interlayer insulating film 26 that uses support film 27d as a mask, a chemical solution not only gradually penetrates from the peripheral part to the central part so as to infiltrate around individual lower electrodes 29b, but also penetrates from opening pattern 32b. Accordingly, etching advances from the peripheral part to the center part of compensation capacitance region 53b, while etching also advances from the center part to the peripheral part of compensation capacitance region 53b. The etching process is stopped when third interlayer insulating film 26 has been removed at the memory cell region, not shown.

After completion of the etching process, at the part of line C-C in FIG. 19, as shown in FIG. 20, third interlayer insulating film 26b remains in a convex shape from around the center to both sides. Thus, also in this example, as with the first exemplary embodiment, third interlayer insulating film 26b improves the intimate contact of lower electrodes 29b to the lower layer, thereby preventing lower electrodes 29b from being peeled off in the cleaning step and the like.

As described in the two Examples, also in this exemplary embodiment, advantageous effects analogous to those of the first exemplary embodiment can be attained. By taking into account a combination of both the first and second exemplary embodiments, it can be understood that the amount and the shape of core oxide film to be left can be adjusted by the opening pattern of the support film. The support film functions as the etching mask for wet etching on the core oxide film. The amount and the shape of the remaining core oxide film can be controlled by adjusting the presence or the absence or the number or the arrangement of the opening patterns of the support film. As a result, the capacitance value of compensation capacitance element 65 which is a concave capacitor, can also be controlled.

In the aforementioned exemplary embodiment, the description has been made using the case of the compensation capacitance element to be connected to wiring for supplying the decoder circuit with the internal power source voltage. However, the present invention may be applied to another capacitance element.

As described in the exemplary embodiments and Examples, even in a case where the area of the cylinder-type lower electrodes that come into contact with the lower layer is small, the lower electrodes can be prevented from being peeled off in the cleaning step and the like.

It is apparent that the present invention is not limited to the above embodiments, but may be modified and changed without departing from the scope and spirit of the invention.

What is claimed is:

1. A semiconductor device, the device comprising:
a plurality of lower electrodes which are cylindrical;
a core insulating film that is provided at an area between parts of the plurality of lower electrodes;
a capacitance insulating film that covers inner walls of the plurality of lower electrodes, and outer walls of the plurality of lower electrodes except for the parts of the plurality of lower electrodes covered by the core insulating film; and
an upper electrode that fills insides of the plurality of lower electrodes and gaps between the plurality of lower electrodes through the capacitance insulating film,
wherein a section in a stacking direction of the core insulating film has a mountain shape in which the bottom is wider than the top.

2. The semiconductor device according to claim 1, wherein the device further comprises a conductive pad that is connected to bottoms of the plurality of lower electrodes.

3. A semiconductor device comprising:
a base member including a semiconductor substrate;
a first and second conductive members formed on the base member, each of the first and second conductive members being electrically connected by the base member;
a core insulating film between the first and second conductive members and having an upper surface oblique to an upper surface of the base so that the upper surface of the core insulating film is at different heights of the first and second conductive members, the core insulating film contacting with the side surface of the first and second conductive members and the base member;
a dielectric film covering the first and second conductive members and the core insulating film, the dielectric film having a greater dielectric-constant than the core insulating film; and
a conductive film between the first and second conductive members and on the core insulating film via the dielectric film.

4. A semiconductor device comprising:
a base member including a semiconductor substrate;
a first and second conductive members formed on the base member, each of the first and second conductive members being electrically connected by the base member;
a first core insulating film being buried between the first and second conductive members so that an upper surface of the first core insulating film is arranged at intermediate level of a height of the first and second conductive members, the first core insulating film contacting with the side surface of the first and second conductive members and the base member;
a dielectric film covering the first and second conductive members and the first core insulating film, the dielectric film having greater dielectric-constant than the first core insulating film;
a conductive film formed between the first and second conductive members and on the first core insulating film via the dielectric film;
a third conductive member formed on the base member, the third conductive member being placed adjacently to the first conductive member, the third conductive member being electrically connected with the first and second conductive members by the base member; and
a second core insulating film being buried between the first and third conductive members so that an upper surface of the second core insulating film is arranged at intermediate level of a height of the first and second conductive members, the second core insulating film contacting with the side surface of the first and third conductive members and the base member;
wherein the dielectric film further covers the third conductive member and the second core insulating film,
the conductive film is further formed between the first and third conductive members and on the second core insulating film via the dielectric film, and
the upper surface of the first core insulating film is arranged at different level from the upper surface of the second core insulating film.

5. The semiconductor device according to claim 4 further comprising: a support film supporting the first, second and third conductive members at upper portions of these conductive members.

6. The semiconductor device according to claim 5, wherein opening patterns are provided with the support film and area density of the opening patterns at a peripheral portion of the support film is lager than area density of the opening patterns at a center portion of the support film.

7. The semiconductor device according to claim 5, wherein opening patterns are provided with the support film and the opening patterns are arranged along peripheral sides of the support film.

8. The semiconductor device according to claim 4 further comprising: a capacitor being composed of the first, second and third conductive members as a lower electrode, the dielectric film, and the conductive film as an upper electrode.

9. The semiconductor device according to claim 6 further comprising:
a memory cell region in which memory cells are provided; and
a peripheral circuit region which is arranged at an outer side of the memory cell region,
wherein the support film is provided with the a portion of the peripheral circuit region.

10. The semiconductor device according to claim 9 further comprising:
a memory cell region in which memory cells are provided; and
a peripheral circuit region which is arranged at an outer side of the memory cell region,
wherein the capacitor is provided with a portion of the peripheral circuit region and the capacitor is a compensation capacitance element.

* * * * *